(12) United States Patent
Lindstedt

(10) Patent No.: US 6,936,500 B2
(45) Date of Patent: Aug. 30, 2005

(54) METHOD FOR THE LATERAL CONTACTING OF A SEMICONDUCTOR CHIP

(75) Inventor: Reidar Lindstedt, München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/901,931

(22) Filed: Jul. 29, 2004

(65) Prior Publication Data

US 2005/0059230 A1 Mar. 17, 2005

(30) Foreign Application Priority Data

Jul. 29, 2003 (DE) .......................................... 103 34 634

(51) Int. Cl.⁷ .......................... H01L 21/50; H01L 21/44; H01L 21/30
(52) U.S. Cl. ....................... 438/113; 438/114; 438/455; 438/458; 438/615
(58) Field of Search ............................... 438/113, 114, 438/455, 458, 615

(56) References Cited

U.S. PATENT DOCUMENTS

| | | | |
|---|---|---|---|
| 5,083,234 A | | 1/1992 | Lehto et al. |
| 5,250,466 A | * | 10/1993 | Gerner et al. ................ 438/605 |
| 6,297,091 B1 | * | 10/2001 | Roh et al. .................... 438/256 |
| 6,303,408 B1 | * | 10/2001 | Smith .......................... 438/106 |
| 6,830,959 B2 | * | 12/2004 | Estacio ......................... 438/113 |
| 6,835,642 B2 | * | 12/2004 | Yang et al. .................. 438/601 |
| 6,849,953 B2 | * | 2/2005 | Smith .......................... 257/778 |
| 2002/0072152 A1 | * | 6/2002 | Urushima .................... 438/108 |
| 2002/0109133 A1 | | 8/2002 | Hikita et al. |
| 2004/0155359 A1 | * | 8/2004 | Shen .......................... 257/782 |

FOREIGN PATENT DOCUMENTS

DE         40 23 776 C2      2/1991

* cited by examiner

Primary Examiner—Alexander Ghyka
(74) Attorney, Agent, or Firm—Slater & Matsil, L.L.P.

(57) ABSTRACT

A description is given of a method for the lateral contacting of a semiconductor chip in which, in the case of a first semiconductor chip (11), which has an electrical contact (17) in a side face (14), a layer (27) of an adhesive material (2) is applied to an exposed contact area (17a) and a preformed particle (23) of an electrically conductive material which can be made to melt by supplying heat is applied to the layer (27). A second semiconductor chip (12) is placed against the first semiconductor chip (11) in such a way that the particle (23) adhering to the first semiconductor chip (11) touches an electrical contact (18) of the second semiconductor chip, and both the semiconductor chips (11, 12) and the particle are heated until the particle (23) fuses onto the electrical contacts (17, 18) of the first and second semiconductor chips. The method according to the invention makes electrical contacting of semiconductor chips (11, 12) possible via their side faces with the aid of soldering or bonding techniques which can conventionally only be used for horizontally mounted areas to be contacted.

17 Claims, 5 Drawing Sheets

METHOD FOR THE LATERAL CONTACTING OF A SEMICONDUCTOR CHIP

This application claims priority to German Patent Application 103 34 634.1, which was filed Jul. 29, 2003 and is incorporated herein by reference.

TECHNICAL FIELD

The invention relates to a method for the lateral contacting of a semiconductor chip.

BACKGROUND

Once integrated circuits of semiconductor chips have been produced on a wafer and the wafer has been separated into individual chips, the chips are usually enclosed in a package, to which they are connected by means of a multiplicity of electrical contacts. The packaged chip is then connected by means of contacts on the package to a larger unit, for example a motherboard, or to a memory module. The semiconductor chip itself has on its upper side, on which the integrated semiconductor circuit is produced, contact areas (pads), which are contacted by the package contacts on the chip, for instance by bonding, soldering or other connecting techniques.

Sometimes semiconductor chips are also electrically connected to other hardware components unpackaged, i.e., without a package being interposed.

In all cases, the semiconductor chip is exclusively contacted from its upper side, i.e., from that side on which the integrated semiconductor circuit is located. This type of contacting follows almost inevitably from the fact that a multiplicity of microscopically small contacts, with dimensions of a few 100 nm or less, have to be positionally adjusted in relation to one another and reliably connected to the package. Since the integrated semiconductor circuit of a semiconductor chip itself has a multiplicity of positionally adjusted and dimensionally optimized switching elements and other structures, the contact pads or contact areas for the contacting through the package are also integrated in the integrated semiconductor circuit. The contact areas are lithographically patterned as a component part of the upper interconnect levels and are produced during the production of the interconnects. A multiplicity of such contact areas distributed over the surface area of the integrated semiconductor circuit can be contacted for instance with the aid of bonding wires or other electrical connecting means.

The not yet laid-open German patent application 103 08 926.8 describes an arrangement of two semiconductor chips which have in their side faces electrical contacts which are to be laterally connected to one another.

In practice the question arises as to how such contacts can be connected by production techniques to form a reliable, durable and positionally adjusted connection of all the electrical lines between the chips. The sawing out of the chips and the pressing of their side faces against one another cannot alone lead to such a connection, if only because the electrical contacts contained in the side faces are flush with the side faces; the electrical contacts, however, must be connected to one another outside the side faces.

Conventional techniques that are used in semiconductor technology are either soldering techniques or bonding techniques, in which additional material is applied to electrical contacts and at the same time heated, in the case of bonding additionally pressed and irradiated with ultrasound. If bonding or soldering techniques were likewise used for the electrical contacting of lateral contacts produced in chip side faces, pressing of the semiconductor chip in the lateral direction to make the lateral contacts establish contact would at the same time lead to a movement of the mounted semiconductor chip on its carrier, and consequently destroy the semiconductor circuit, or at least damage the contact areas of its metallization level or cause faulty contacts. At the same time, therefore, conventional bonding or soldering techniques cannot necessarily be used for lateral and vertical contacts.

There is no known laid-open method by which such an arrangement of semiconductor chips connected to one another via their side faces can be produced in a simple way and by which the electrical contacts can be connected to one another at the side faces, in order that such an arrangement can be produced reliably, i.e., with an adequately low reject rate, with acceptable technological complexity. In particular, soldering connection techniques are conditional on both semiconductor devices that are to be soldered to one another being in a horizontal position and are therefore not conventionally suitable for producing lateral contacts on chip side faces, especially not at the same time as the contacting of a main chip area.

SUMMARY OF THE INVENTION

In one aspect, the present invention provides a method where a first semiconductor chip is provided from a wafer of substrate material. The first semiconductor chip has an electrical contact which has an exposed contact area in a side face of the first semiconductor chip. A layer of an adhesive material is applied to the exposed contact area selectively in relation to the substrate material. A preformed particle of an electrically conductive material which can be made to melt by supplying heat is pressed onto the layer. The first semiconductor chip is placed against a second semiconductor chip in such a way that the particle adhering to the first semiconductor chip touches an electrical contact of the second semiconductor chip. The semiconductor chips with the particle are heated until the particle fuses onto the electrical contacts of the first and second semiconductor chips.

According to the preferred embodiment of the invention, a method by which electrical contacts of a semiconductor chip can be produced on a side face of the semiconductor chip and simultaneously on this side face and on a main area of the semiconductor chip is provided.

Methods according to embodiments of the invention solve the problem of simultaneously contacting lateral contacts in chip side faces and conventional contacts within the main area of a chip by additional conductive material, which has to be appropriate for electrical contacting, in the form of a preformed particle being pressed against an adhesive layer or adhesion layer that has been applied to a contact area on the chip on the side faces of the semiconductor chip. The adhesive layer has the effect firstly that additional conductive material in solid form, the particle, is positioned and held closely against the contact on the chip, before the additional conductive material is fused to the contact on the chip and also to that of a further semiconductor chip by the action of heat. The temporary adhesive attachment of the particle allows for instance soldering and bonding techniques to be used independently of the direction of gravitational force. In particular, conventional soldering or bonding techniques can also be used for the first time on chip side faces which are not oriented horizontally but vertically. As a result, with the aid of the method according to the invention, a main area and one or more side faces of the chip can be contacted simultaneously. The preferably selective application of the adhesion layer exclusively to the contacts on the chip has the effect of avoiding soiling of the substrate surface.

The durable, solid and conductive connection between the contacts of two chips is achieved by the heating step, in which the lateral contacts of a first semiconductor chip, onto which a particle is respectively adhesively attached, are fused together with those, preferably lateral contacts of a further semiconductor chip at relatively high temperatures. Connections of a number of chips to one another that are established in this way permit low-noise signal transmissions even with high frequencies and with small signal amplitudes, for which conventional bonding or soldering contacts are unsuitable if only because of the length of the additional interconnects.

It is preferably provided that such a second semiconductor chip that has its electrical contact in a side face is placed against the first, so that in the heating step the particle contacts the side faces of both semiconductor chips. In this case, two chips with lateral contacts are connected to one another; the positions of their lateral contacts within the respective chip side face correspond to one another.

It is preferably provided that the layer of the adhesive material is applied to the exposed contact area by spraying. The spraying may be carried out with the aid of micronozzles, it being ensured that only the electrical lateral contacts and their immediate vicinity are provided with the adhesive layer.

It is alternatively provided that the layer of the adhesive material is applied to the exposed contact area selectively in relation to the substrate material by at least partial immersion of the semiconductor chip in a solution. The solution may be of such a nature that the solvent forms an adhering adhesive layer of adhesive material only on metallic surfaces.

A further alternative embodiment provides that the layer of the adhesive material is applied to the exposed contact area by the semiconductor chip being exposed to an atmosphere containing adhesive material, from which the adhesive material is deposited on the contact area. Here, too, the chemical composition of the atmosphere may be chosen such that an adhesion layer is exclusively produced on metallic surfaces.

Preferred embodiments provide that an adhesive material which adheres on an interconnect material, preferably on aluminum, is used for the layer, and that a particle of a solder material is used as the preformed particle.

One development provides that, when the semiconductor chip is heated, at the same time particles are also fused onto contacts in a main area of the first semiconductor chip. This allows electrical contact connections to further semiconductor devices to be established on two or more areas of a semiconductor chip by the same method steps.

According to one development, it may be provided that an electrically conductive layer is electrolytically deposited on the exposed contact area before the adhesive is applied, whereby the contact is elevated with respect to the side face of the first semiconductor chip. As a result, the contact area to be contacted is elevated with respect to the surrounding side face of the semiconductor chip, whereby the solder material to be heated has to be brought less close to the semiconductor chip and there is less thermal stress.

It is preferably provided that a carrier substrate which has electrical contacts in a main area is additionally provided, and that, between placing the chips together and heating the chips, the first and second semiconductor chips are placed onto the carrier substrate in such a way that the electrical contacts of the carrier substrate touch electrical contacts of the first and second semiconductor chips. In this case, apart from the lateral contacting of two semiconductor chips with respect to one another (the first and the second), a connection is additionally established with respect to a third chip, a carrier substrate, on the main area of which the two chips are placed. The contacting of this carrier substrate may take place with the aid of conventional soldering or bonding contacts, which are arranged within the main area of the carrier substrate. This makes it possible for semiconductor chips to be simultaneously attached to one another in vertical and horizontal directions.

It is preferably provided that, while placing the chips together, the first and second semiconductor chips are temporarily positioned over the carrier substrate by spacers. For example, adhesive spots or other at least provisional means of adhesion may be used in order to keep the first and second semiconductor chips positionally adjusted in relation to one another and the carrier substrate on the latter until the thermal treatment commences and brings about the durable electrical connection.

It is preferably provided that the electrical contact of the first semiconductor chip is established by exposing a conductive structure in certain regions in the interior of the wafer during the separation of the wafer into individual chips. In particular, by sawing the wafer, an interconnect or a conductive filling connected to the interconnect may be sawed through for this. The sawing through of an interconnect or of a widened contact has the consequence of exposing a contact area which constitutes a component part of the chip side face produced by sawing and which can be elevated by the electrolytic deposition according to the invention, so that it protrudes. The interconnects or the conductive filling, which initially form the electrical contacts, may consist of aluminum, material containing aluminum or of copper or titanium compounds, for example alloys of copper or titanium with other metals.

It goes without saying that in practice every chip has a multiplicity of lateral contacts, whereby a complete data exchange is achieved between the two chips connected laterally or vertically with the aid of the contacts according to the invention.

Similarly, every semiconductor chip will in each case have an integrated semiconductor circuit; the semiconductor circuit is connected internally in the chip to the electrical contacts of the respective semiconductor chip.

In particular, semiconductor chips with a semiconductor memory, preferably with a dynamic read-write memory, can be connected via their side faces to one another and via their main areas to a carrier substrate, for example a printed circuit board of a memory module, by the method according to the invention.

BRIEF DESCRIPTION OF THE DRAWINGS

The invention is described below on the basis of FIGS. 1 to 13, in which:

FIGS. 9D to 13 show further steps of the method according to the invention.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Figure 1:
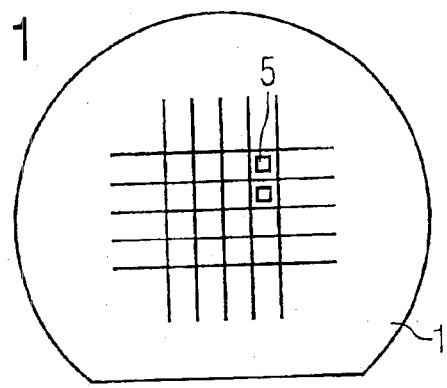
FIGS. 1 to 4 show first steps of the method according to the invention.

According to FIG. 1, a semiconductor wafer 1 is processed, so that an integrated semiconductor circuit 5 is produced on it. This is shown enlarged in FIG. 2. Double lines between integrated semiconductor circuits 5 neighboring one another indicate sawing frames, which are sawed along the arrows shown, the region of the original wafer that respectively lies within a double line being removed. By this sawing operation, conductive structures 4, 6, which respectively extend from a semiconductor circuit 5 into the sawing frame, are broken up or severed and exposed in a partial region.

Figure 2:
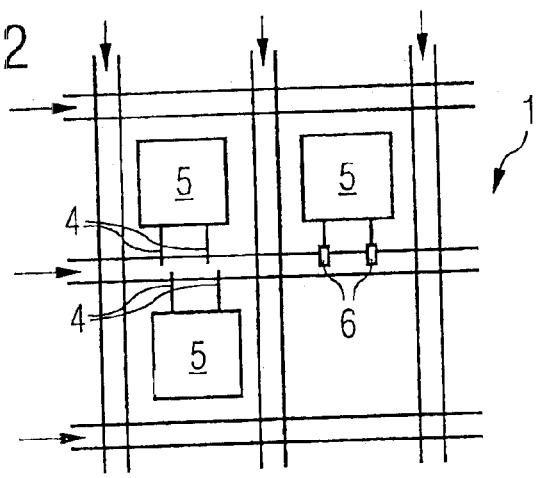

FIG. 2 shows on the left-hand side two integrated circuits 5, the conducting structures of which are interconnects 4 which extend into the sawing frame and end there. The third semiconductor chip that is represented, at the top right in FIG. 2, has in the region of the sawing edge conductive fillings 6, which have a wider cross-section or diameter than the interconnects 4 and can therefore be contacted more easily at a later stage of the method.

Figure 3:
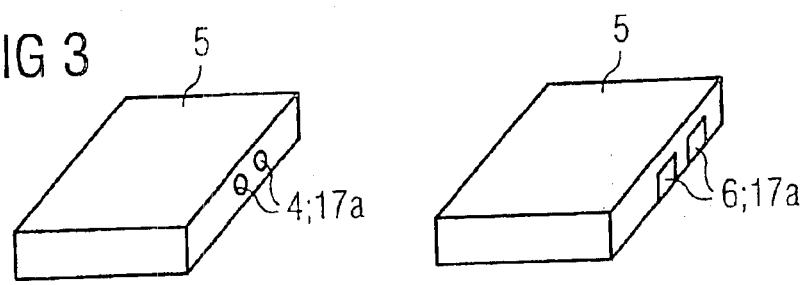

FIG. 3 shows the outlet profile of both conductive structures, the interconnects 4 and the conductive fillings 6, on the side edges of the individually separated semiconductor chips 5.

Figure 4:
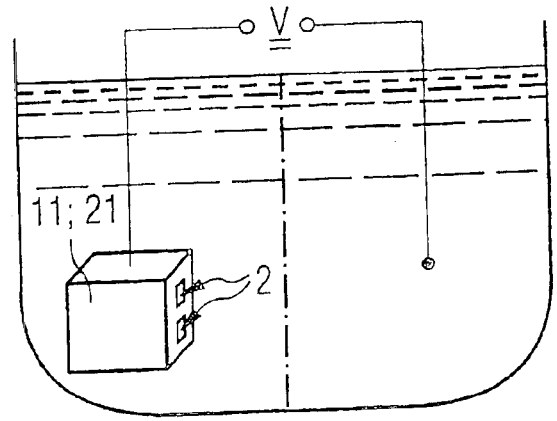

According to one development of the invention, as represented in FIG. 4, an electrodepositing process, in which a conductive material 2 contained in an electrolytic fluid is selectively deposited on the exposed surfaces of the electrical contacts of the first semiconductor chip, may be carried out. The semiconductor chip 11 is connected to one of the electrodes. Given suitable choice of an electrolytic process, the conductive material 2 grows exclusively on the contact areas represented in FIG. 3 of the conductive structures 4 and 6, without the conductive material 2 being deposited on the wafer material or on other structures of the integrated semiconductor circuit. However, it may be provided that growth also takes place at the same time on electrical contacts on a main area of the first (or the second or further) semiconductor chip, in particular if it consists of the same material as the conductive structures 4 and 6. Such an electrolytic process step may serve the purpose of increasing the distance between the chip side face 14 and the particle to be laterally pressed on, whereby the thermal stress for the chip is less when the particle is heated.

Figure 5:
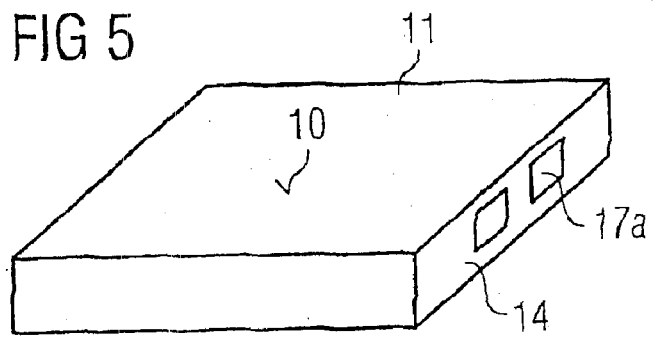
FIGS. 5 to 8 show a semiconductor chip with differently formed electrical contacts depending on the process step.

FIG. 5 shows an enlargement of a semiconductor chip 11 according to FIG. 3, in the side face 14 of which the surface 17a that is exposed by sawing of two electrical contacts can be seen. The contacts may be interconnects led up to the edge of the chip or fillings that are widened in comparison with said interconnects and have greater lateral dimensions.

Figure 6:
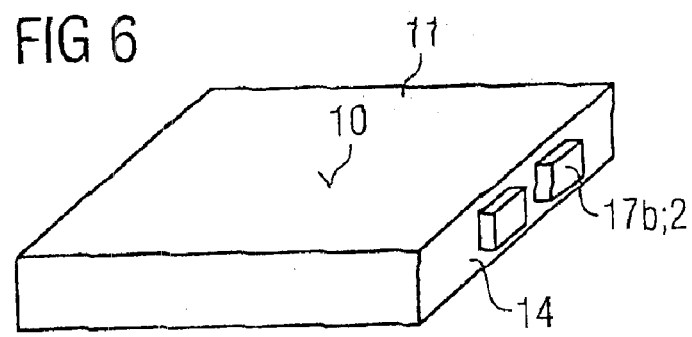

The growth of the conductive material 2 by the electrolytic process according to FIG. 4 leads to the contacts represented in FIG. 6, which are elevated with respect to the side face 14 on account of the additional material 2 which has been deposited on the contact areas 17a of FIG. 5. The electrolytic process allows the projecting height of these electrical contacts 17b to be controlled very accurately, for example by setting the concentration of the electrolyte, the electrolysis voltage or the duration of the electrolysis.

Figure 7:
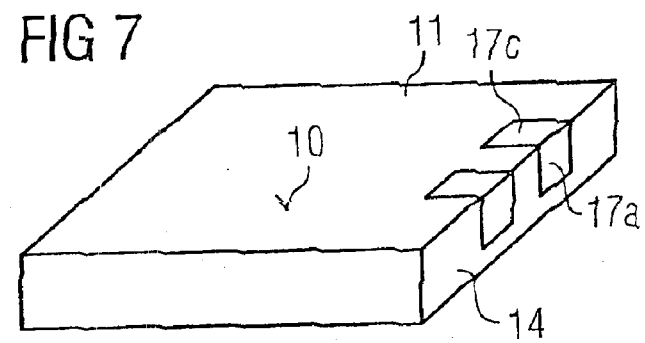
Figure 8:
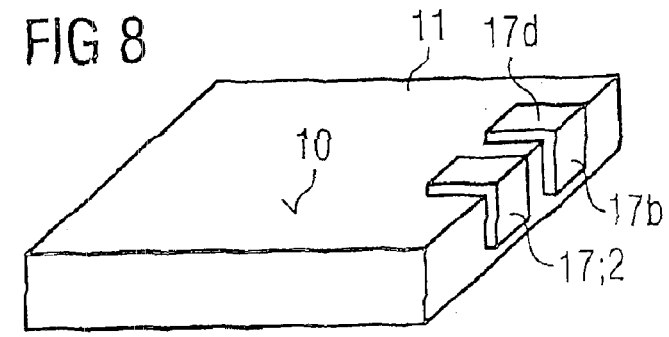

FIGS. 7 and 8 show an embodiment of a first semiconductor chip 11 in which the contacts in the side face 14 have in addition to a surface region 17a in this side face 14 also a contact area 17c within a main area 10, for example the upper side of the integrated semiconductor circuit, so that the lateral contacts reach around the edge between the main area 10 and the side face 14. During the electrolytic growth according to FIG. 4 the contact 17 is formed As shown in FIG. 8, the contact 17 is elevated above both the main area and the side face and can be used for the simultaneous vertical and horizontal electrical connection of the first semiconductor chip to further semiconductor chips; in particular, the contact region 17d also extends above the main area 10, so that the first semiconductor chip 11, placed in full surface area contact with the main area on a carrier substrate, rests on the contact region 17d.

Figure 9A:
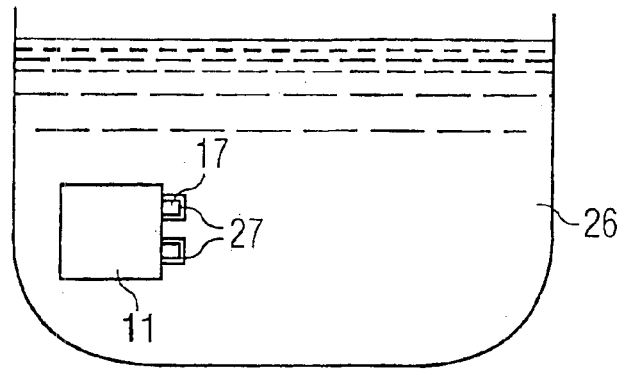
FIGS. 9A to 9C show method steps of the method according to the invention that are alternatives to one another.
Figure 9B:
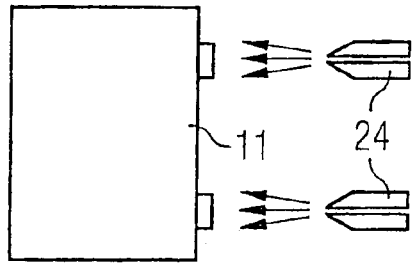
Figure 9C:
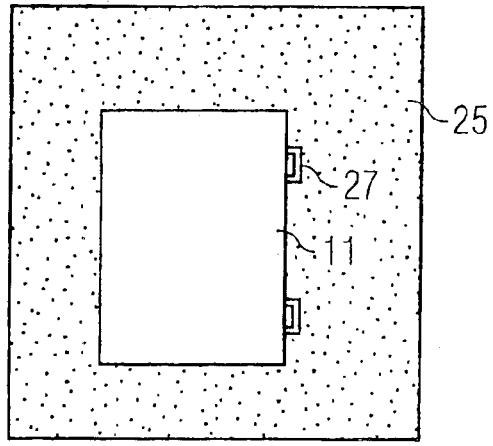

FIGS. 9A to 9C show process steps that are alternatives to one another for applying the layer 27 of the adhesive material 2 to the contact areas 17, preferably selectively in relation to the remaining chip side face 14. According to FIG. 9A, the layer of adhesive material is achieved by at least partial immersion in a solution, whereby preferably its exclusively metallic surfaces that are wetted.

As an alternative to this, according to FIG. 9B, the layer of adhesive material 27 may be sprayed on with the aid of micronozzles 24, dispensing with subsequent drying of the chip 11.

In yet another embodiment, according to FIG. 9C, the chip 11 may also be exposed to an atmosphere containing adhesive material, in order to deposit the layer of adhesive material on the contact areas of the lateral chip contacts.

Figure 9D:
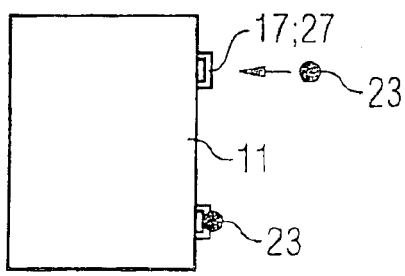

Finally, according to FIG. 9D, the particles 23 of the conductive material which can be made to melt by increasing the temperature, for example of a solder material, are applied to the contact areas 17 provided with the layer 27, onto the layer of the adhesive material which has been applied for example according to a method step of FIGS. 9A to 9C. The electronic components 11, 12, 13 provided with these particles are together represented in FIG. 10; preferably, particles 23a are also applied to corresponding adhesion layer areas 7, 8 of the semiconductor chip 11 and 12. In this case, the spherically represented particles 23, 23a are pressed into the respective adhesive layer 27, the metallic layer of the chip contact that is lying underneath almost being contacted already. The distance due to the remaining adhesion layer is bridged by the thermal treatment in the heating step, in which the adhesion layer is displaced, whereby a conducting contact connection is produced.

Figure 10:
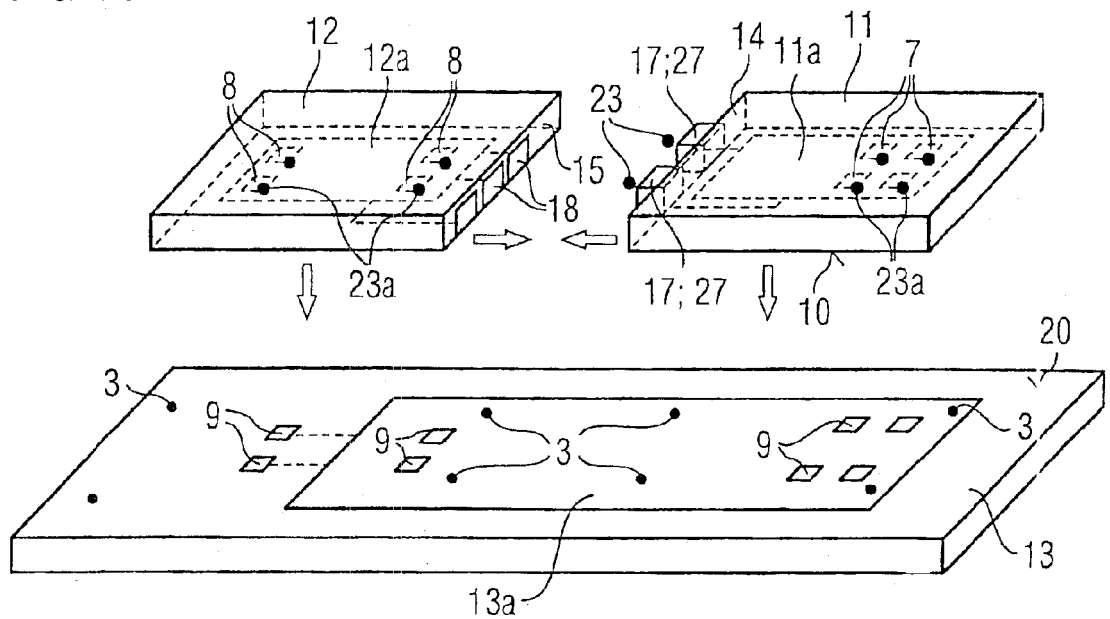

FIG. 10 shows altogether an arrangement of a first semiconductor chip 11, a second semiconductor chip 12 and a carrier substrate 13, these components still being represented on their own and not yet electrically and mechanically connected to one another. The semiconductor chips 11 and 12 are pressed against one another in the direction of the arrows and preferably also placed on the carrier substrate 13 in the direction of the double arrows. In this case, the electrical contacts 17 of the first semiconductor chip 11 contact the electrical contacts 18 of the second semiconductor chip 12. For contacting the carrier substrate 13, both semiconductor chips 11, 12 have further electrical contacts 7, 8, which are arranged in a conventional way in the region of the main areas 10 and constitute a component part of the integrated semiconductor circuits 11a, 12a. Dashed lines between these semiconductor circuits and the contacts 17 and 18 indicate the internal connection in the chip between these contacts and the integrated semiconductor circuits; these connections are, for example, interconnects. In FIG. 10, these additional electrical contacts 7, 8 are preferably located on the lower main areas of the chips 11 and 12, which are facing the carrier substrate 13, and are covered in each case by a particle 23 and 23a.

For the provisional mechanical fastening of the two semiconductor chips 11, 12 on the carrier substrate 13, provisional spacers 3 may be provided, fixing the semiconductor chips 11 and 12 mechanically with respect to one another and with respect to the carrier substrate 13 until the durable electrical and mechanical connection is established by the thermal treatment. During this, the further contacts 7, 8 of the semiconductor chips 11, 12 are also connected to corresponding contacts 9 of the main area of the carrier substrate 13. These contacts 9 likewise constitute a component part of a corresponding integrated semiconductor circuit 13a or are at least connected to it, as in the case of the two contacts 9 on the left, by interconnects indicated by dashed lines.

Figure 11:
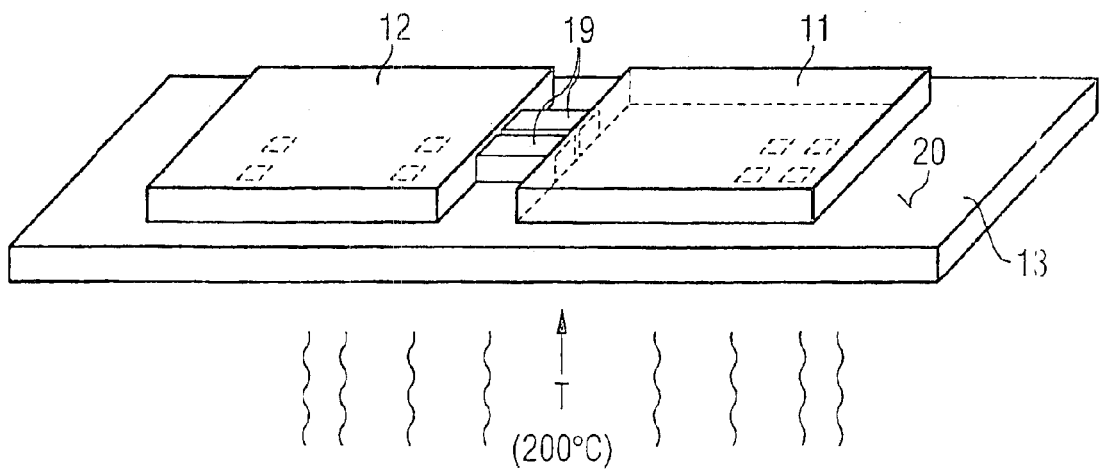

FIG. 11 shows an arrangement with two semiconductor chips 11, 12 placed against one another on a carrier substrate 13 and connected to one another in an electrically conducting manner. When the components were placed against one another, soldering connections were simultaneously produced on a main area 10 and on a side face 14 of the first semiconductor chip 11, which was not conventionally possible. The laterally pressed-on, initially solid particles 23 cannot flow in an uncontrolled manner while they are being heated and the second semiconductor chip 12 is being pressed against them. With conventional use of soldering or bonding techniques, on the other hand, a usually already preheated conductive material is brought up to the contact area that is to be contacted and then applied in a liquid form with the aid of additional auxiliary means, with flowing and spreading of the conductive material already occurring, initially in the direction of gravitational force. Such spreading of the material is prevented in the case of the method according to the preferred embodiment.

Figure 12:
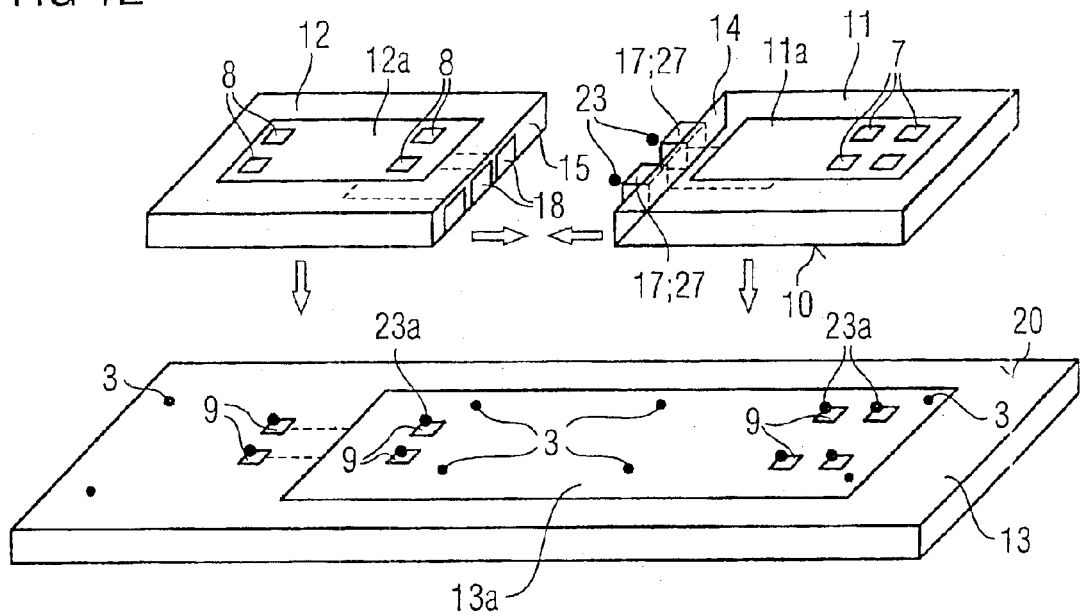

A further alternative embodiment, which corresponds to the method step of FIG. 11, is represented in FIG. 12. In this case, the particles 23 are applied on the one hand to the side face 14 of the first semiconductor chip 11, on the other hand to the main area 20 or upper side of the carrier substrate 13. The particles 23, 23a are all represented in the form of dots.

Figure 13:
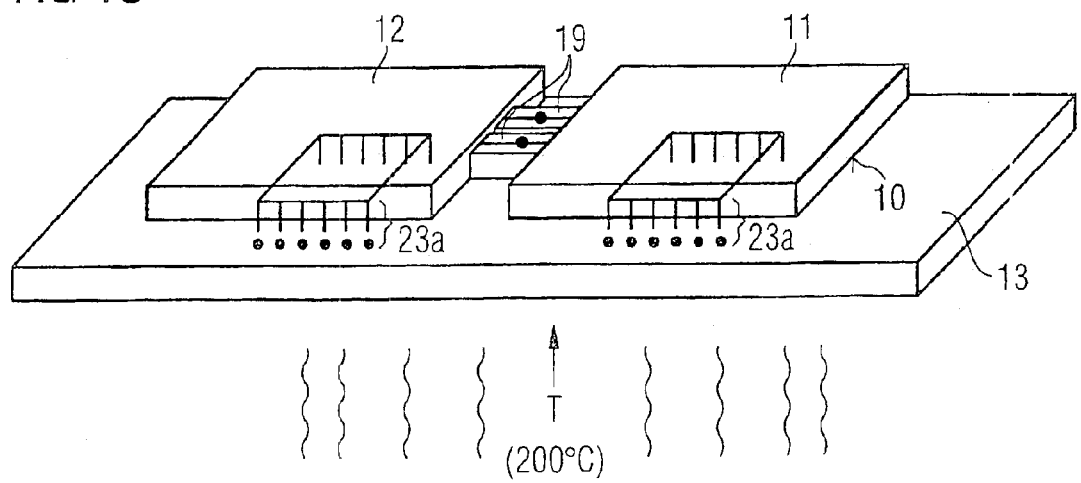

FIG. 13 shows how, with the aid of a soldering or bonding process, a multiplicity of particles 23a can be produced with schematically depicted contacts of the semiconductor chips 11, 12 and simultaneously also lateral contact connections 19 between the two semiconductor chips 11, 12, by means of which a number of semiconductor chips 11, 12 can be electrically contacted with respect to one another, unpackaged, via their side faces. The short contact connections 19 are better suited for radio-frequency signals or for especially weak signals than voluminous, and therefore less low-noise, bonding or soldering connections.

On account of the simultaneous formation of the lateral and vertical contact connections, no additional process steps are required.

The arrangement of at most three semiconductor chips represented in the figures is merely shown by way of example. In principle, any number of semiconductor chips may be arranged on top of one another and next to one another and be connected horizontally and vertically to one another. The lateral contact connections 19 and elevated contacts 17, exaggerated in the figures, are in practice very small and make it possible for semiconductor chips 11, 12 to be placed against one another virtually without any appreciable intermediate space and consequently without any appreciable loss in signal transmission. This also permits easy adjustment with respect to the contacts 9 of the carrier substrate 13.

With regard to the implementation of the flowing process and the control of the extent of melting of the elevated lateral contacts, it is possible to rely on any of the conventional thermal treatments for forming conductive contact connections, for instance soldering or bonding. The way according to the invention in which particles are positioned on adhesive side face contacts allows these conventional techniques to be additionally used on chip side faces.

Although the present invention and its advantages have been described in detail, it should be understood that various changes, substitutions and alterations can be made herein without departing from the spirit and scope of the invention as defined by the appended claims.

What is claimed is:

1. A method for the lateral contacting of a semiconductor chip, the method comprising:
   producing a first semiconductor chip from a wafer of substrate material, the first semiconductor chip having an electrical contact which has an exposed contact area in a side face of the first semiconductor chip;
   applying a layer of an adhesive material to the exposed contact area selectively in relation to the substrate material;
   pressing a preformed particle of an electrically conductive material which can be made to melt by supplying heat onto the layer and placing the first semiconductor chip against a second semiconductor chip in such a way that the particle adhering to the first semiconductor chip touches an electrical contact of the second semiconductor chip; and
   heating the first and second semiconductor chips with the particle until the particle fuses onto the electrical contacts of the first and second semiconductor chips.

2. The method as claimed in claim 1, wherein the electrical contact of the second semiconductor chip is located in a side face so that the particle contacts the side faces of both the first and second semiconductor chips.

3. The method as claimed in claim 1 wherein the layer of the adhesive material is applied to the exposed contact area by spraying.

4. The method as claimed in claim 1 wherein the layer of the adhesive material is applied to the exposed contact area selectively in relation to the substrate material by at least partial immersion of the semiconductor chip in a solution.

5. The method as claimed in claim 1 wherein the layer of the adhesive material is applied to the exposed contact area by the semiconductor chip being exposed to an atmosphere containing adhesive material, from which the adhesive material is deposited on the contact area.

6. The method as claimed in claim 1 wherein applying an adhesive material comprises applying an adhesive material that adheres on an interconnect material.

7. The method as claimed in claim 1 wherein pressing a preformed particle comprises pressing a particle of a solder material.

8. The method as claimed in claim 1 wherein, when the semiconductor chip is heated, at the same time particles are fused onto contacts in a main area of the first semiconductor chip.

9. The method as claimed in claim 1 wherein an electrically conductive layer is electrolytically deposited on the exposed contact area before applying the layer of adhesive material, whereby the contact is elevated with respect to the side face of the first semiconductor chip.

10. The method as claimed in claim 1 and further comprising:

providing a carrier substrate which has electrical contacts in a main area; and placing the first and second semiconductor chips onto the carrier substrate in such a way that the electrical contacts of the carrier substrate touch electrical contacts of the first and second semiconductor chips.

11. The method as claimed in claim 10 wherein the first and second semiconductor chips are temporarily positioned over the carrier substrate by spacers before heating the first and second semiconductor chips.

12. The method as claimed in claim 1 wherein the electrical contact of the first semiconductor chip is established by exposing a conductive structure in certain regions in the interior of the wafer during the separation of the wafer into individual chips.

13. The method as claimed in claim 12 wherein, by sawing the wafer, the interconnect is sawed through.

14. The method as claimed in 12 wherein, by sawing the wafer, a conductive filling connected to the interconnect is sawed through.

15. The method as claimed in claim 1 wherein the first semiconductor chip comprises a chip with a semiconductor memory.

16. The method as claimed in claim 15 wherein the chip with a semiconductor memory comprises a dynamic read write memory.

17. The method as claimed in claim 1 wherein the adhesive material comprises aluminum.

* * * * *